US008442524B2

(12) United States Patent
Jendbro et al.

(10) Patent No.: US 8,442,524 B2
(45) Date of Patent: May 14, 2013

(54) METHODS, SYSTEMS, AND DEVICES FOR IDENTIFYING AND PROVIDING ACCESS TO BROADCAST MEDIA CONTENT USING A MOBILE TERMINAL

(75) Inventors: Magnus Jendbro, Staffanstorp (SE); Thomas Ekdahl, Sodra Sandby (SE); Ola Jonsson, Helsingborg (SE); Markas Andreasson, Helsingborg (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 1281 days.

(21) Appl. No.: 11/466,870

(22) Filed: Aug. 24, 2006

(65) Prior Publication Data
US 2008/0020702 A1 Jan. 24, 2008

Related U.S. Application Data

(60) Provisional application No. 60/831,811, filed on Jul. 19, 2006.

(51) Int. Cl.
*H04W 4/00* (2009.01)
(52) U.S. Cl.
USPC .... 455/434; 455/3.01; 455/435.2; 455/456.3; 455/515; 455/456.2
(58) Field of Classification Search .............. 455/414.2, 455/414.1, 14.2, 434, 3.01–3.06, 456.1–457, 455/435.2, 515
See application file for complete search history.

(56) References Cited

U.S. PATENT DOCUMENTS

| | | | |
|---|---|---|---|
| 6,134,443 A * | 10/2000 | Spann et al. | 455/450 |
| 6,259,923 B1 * | 7/2001 | Lim et al. | 455/456.2 |
| 6,266,614 B1 * | 7/2001 | Alumbaugh | 701/211 |
| 6,389,284 B1 * | 5/2002 | Cook et al. | 455/434 |
| 6,728,522 B1 * | 4/2004 | Marrah et al. | 455/179.1 |
| 6,728,531 B1 | 4/2004 | Lee et al. | |
| 6,999,716 B1 * | 2/2006 | Andre et al. | 455/3.02 |
| 7,062,272 B2 * | 6/2006 | Grilli et al. | 455/435.1 |
| 7,398,051 B1 * | 7/2008 | Bates et al. | 455/12.1 |
| 7,573,847 B2 * | 8/2009 | Rogers et al. | 370/329 |
| 7,574,170 B2 * | 8/2009 | Jendbro | 455/3.06 |
| 7,706,739 B2 * | 4/2010 | Kjellberg | 455/3.01 |
| 7,711,314 B2 * | 5/2010 | Schadenko | 455/3.01 |
| 8,145,216 B2 * | 3/2012 | Kim et al. | 455/434 |
| 8,155,649 B2 * | 4/2012 | McHenry et al. | 455/434 |
| 2003/0040272 A1 * | 2/2003 | Lelievre et al. | 455/3.06 |
| 2003/0125076 A1 * | 7/2003 | Seppala et al. | 455/556 |
| 2005/0249171 A1 * | 11/2005 | Buckley et al. | 370/338 |
| 2005/0278752 A1 * | 12/2005 | Fujii | 725/68 |
| 2006/0111109 A1 * | 5/2006 | Kim | 455/436 |
| 2006/0166675 A1 * | 7/2006 | Yoon | 455/452.2 |

(Continued)

OTHER PUBLICATIONS

International Search Report and Written Opinion for PCT/EP2007/051432 mailed Jul. 23, 2007.

*Primary Examiner* — Sharad Rampuria
(74) *Attorney, Agent, or Firm* — Myers Bigel Sibley & Sajovec, P.A.

(57) ABSTRACT

A method for providing access to broadcast media content includes determining positioning information corresponding to a current location of a mobile terminal. Based on the determined positioning information, a channel list including available broadcast media content channel information for the current location of the mobile terminal is automatically retrieved. Related systems and devices are also discussed.

33 Claims, 4 Drawing Sheets

U.S. PATENT DOCUMENTS

| | | | |
|---|---|---|---|
| 2006/0195239 A1* | 8/2006 | Teichner et al. | 701/36 |
| 2006/0213966 A1* | 9/2006 | Chuang et al. | 455/414.1 |
| 2007/0039026 A1* | 2/2007 | Yoon et al. | 725/62 |
| 2007/0054637 A1* | 3/2007 | Cho | 455/185.1 |
| 2007/0142055 A1* | 6/2007 | Toivanen et al. | 455/450 |
| 2007/0263124 A1* | 11/2007 | Nishi | 348/570 |
| 2008/0127276 A1* | 5/2008 | Kim et al. | 725/56 |
| 2009/0013371 A1* | 1/2009 | Shibahara | 725/134 |

* cited by examiner

METHODS, SYSTEMS, AND DEVICES FOR IDENTIFYING AND PROVIDING ACCESS TO BROADCAST MEDIA CONTENT USING A MOBILE TERMINAL

CROSS-REFERENCE TO RELATED PATENT APPLICATIONS

This application claims priority from U.S. Provisional Application Ser. No. 60/831,811, filed Jul. 19, 2006, the disclosure of which is hereby incorporated by reference herein in its entirety.

BACKGROUND OF THE INVENTION

The present invention relates to mobile terminals, and more particularly, to methods of operating mobile terminals to provide multimedia services and related devices.

Mobile terminals are widely used to provide a variety of communications, multimedia, and/or data processing capabilities. For instance, mobile terminals, such as cell phones, personal digital assistants, and/or laptop computers, may provide storage and/or access to data in a wide variety of multimedia formats, including text, pictures, music, and/or video. As such, some mobile terminals may include tuner and/or decoder capabilities, thereby allowing mobile terminal users to receive multimedia signals that are broadcast over-the-air (OTA) via terrestrial and/or satellite transmission means. Some examples of signals which may be broadcast over-the-air include analog and/or digital television signals, AM/FM/digital radio signals, and/or Internet protocol broadcasts. In addition, other audio/video content, such as interactive games, music, and/or movies, may also be broadcast. As used herein, text, pictures, audio, and/or video data that may be broadcast over-the-air may be generally referred to as "media content."

For example, Digital Video Broadcasting for Handhelds (DVB-H) is a digital TV service that may be implemented in mobile terminals in the near future. The DVB-H standard is used for broadcasting digital TV signals that are optimized for use in mobile terminals. As such, DVB-H services may be provided to mobile terminal users by a telecommunications service provider, for example, via a subscription-based pricing plan. In such a subscription-based plan, the service provider may provide a TV portal from which subscribers can retrieve frequencies and/or other information required to decode and/or otherwise access broadcast TV channels and/or program content that are available under the subscription.

However, some DVB-H channels may be publicly-accessible and/or otherwise "free" broadcast channels, which may be available to compatibly-equipped mobile terminals without payment therefor. For such free-to-air services, available channels in a particular location may be identified either by scanning the entire UHF frequency band (and/or other applicable frequency band) using the mobile terminal's tuner, or by searching the Internet for a channel list that describes available channels for the particular location and manually entering the channels/frequencies. For DVB-H and/or other digitally encoded signals, it may be relatively time-consuming to identify available channels by scanning, even when the frequency band is known. For example, a mobile terminal tuner may require about 5 minutes or more to identify DVB-H channels that are available at a particular location over a given frequency band. In addition, searching for a channel list for a given location on the Internet, for instance, using an Internet Search Engine, may be even more time-consuming.

As such, a user of a tuner-equipped mobile terminal may be required to perform such time-consuming channel searches in order to find available broadcast media channels every time he visits a new location. For mobile terminal users who frequently travel to different locations, performing such searches may become inconvenient and/or a nuisance.

SUMMARY OF THE INVENTION

According to some embodiments of the present invention, a method for providing access to broadcast media content includes determining positioning information corresponding to a location of a mobile terminal. A channel list including available broadcast media content channel information for the location of the mobile terminal is automatically retrieved based on the determined positioning information.

In some embodiments, a channel list request including the determined positioning information may be transmitted to a server configured to maintain the channel list for the current location. The channel list for the current location may be received from the server responsive to transmitting the channel list request. For example, the channel list request and/or the channel list may be a short message service (SMS) and/or a multimedia message service (MMS) message.

In other embodiments, a server may be configured to maintain a plurality of channel lists for a corresponding plurality of locations. One of the plurality of channel lists may be identified as the channel list for the location of the mobile terminal based on the determined positioning information, and the identified channel list may be transmitted to the mobile terminal.

In some embodiments, a channel list request including the determined positioning information may be received at the server, and the channel list may be transmitted to the mobile terminal responsive to receiving the channel list request.

In some embodiments, the channel list may be automatically retrieved responsive to activation of a mobile terminal application configured to present the broadcast media content.

In other embodiments, the channel list may include at least one available channel for the current location of the mobile terminal and frequency information corresponding thereto. A tuner of the mobile terminal may be tuned to the at least one available channel based on the corresponding frequency information to receive media content broadcast over the at least one available channel. The media content may be presented via a user interface of the mobile terminal.

In some embodiments, the channel list may be displayed via the user interface of the mobile terminal, and a user selection indicating the at least one available channel from the channel list may be received via the user interface. The tuner may be tuned responsive to receiving the user selection.

In other embodiments, the frequency information corresponding to the at least one available channel may be stored in the mobile terminal as channel preset information associated with the positioning information.

In some embodiments, a quality of service (QoS) for the received media content may be determined, and the positioning information of the mobile terminal may be re-determined when the QoS falls below a predetermined threshold. A second channel list including available broadcast media content channel information for a location corresponding to the re-determined positioning information may be automatically retrieved responsive to re-determining the positioning information.

In other embodiments, the channel list may include approximate geographic coverage area information corresponding to the at least one available channel included therein. The positioning information of the mobile terminal may be re-determined at predetermined periods of time, and the re-determined positioning information of the mobile terminal may be compared to the geographic coverage area information for the at least one available channel responsive to re-determining the positioning information. A second channel list including available broadcast media content channel information for a location corresponding to the re-determined positioning information may be automatically retrieved when the re-determined positioning information indicates that the mobile terminal is within a predetermined range of an end of the geographic coverage area for the at least one available channel.

In some embodiments, the channel list may include information corresponding to at least one free over-the-air broadcast media content channel. For example, the broadcast media content may include digital television, digital radio, and/or emergency information signals.

In other embodiments, the positioning information of the mobile terminal may be determined using a first mobile terminal receiver. The channel list may be automatically retrieved using a second mobile terminal receiver. For example, the first mobile terminal receiver may be a global positioning system (OPS) receiver, while the second mobile terminal receiver may be a wireless local area network transceiver (such as a BLUETOOTH®, WI-FI®, and/or infrared transceiver) and/or a public land mobile network transceiver.

In some embodiments, an internet search for the channel list for the current location of the mobile terminal may be automatically performed responsive to determining the mobile terminal positioning information.

In other embodiments, the positioning information may identify a cell in a network corresponding to the current location of the mobile terminal. The channel list may include at least one channel having a geographic coverage area corresponding to the cell.

In some embodiments, the positioning information may identify a country code corresponding to the current location of the mobile terminal. The channel list may include at least one channel having a broadcast frequency corresponding to a frequency band associated with the country code.

In other embodiments, a plurality of positioning signals may be received at the mobile terminal, and ranging measurements may be calculated based on the plurality of positioning signals. The mobile terminal positioning information may be determined based on the ranging measurements.

In some embodiments, a frequency band may be scanned for the available broadcast channel information in parallel with automatically retrieving the channel list.

According to other embodiments of the present invention, a mobile terminal includes a receiver and a controller coupled to the receiver. The controller is configured to determine positioning information corresponding to a location of the mobile terminal and automatically retrieve a channel list comprising available broadcast media content channel information via the receiver based on the positioning information.

In some embodiments, the receiver may include a first receiver and a second receiver. The first receiver may be configured to be used for determining the positioning information of the mobile terminal, and the second receiver may be configured to be used for automatically retrieving the channel list.

In other embodiments, the channel list may include at least one available channel for the current location of the mobile terminal and frequency information corresponding thereto. The mobile terminal may further include a tuner and a user interface coupled to the controller. The tuner may be configured to be tuned to the at least one available channel based on the corresponding frequency information to receive media content broadcast over the at least one available channel. The user interface may be configured to present the received media content.

In some embodiments, the user interface may also be configured to display the channel list and receive a user selection indicating the at least one available channel from the channel list. The tuner may be configured to be tuned to the at least one available channel responsive to receipt of the user selection at the user interface. In addition, the tuner may be configured to scan a frequency band for the available broadcast channel information when the controller automatically retrieves the channel list.

In other embodiments, the mobile terminal may also include a memory device coupled to the controller. The memory device may be configured to store the frequency information corresponding to the at least one available channel as channel preset information associated with the positioning information.

According to further embodiments of the present invention, a system for providing access to broadcast media content includes a server. The server is configured to determine positioning information corresponding to a current location of a mobile terminal. The server is further configured to automatically retrieve a channel list based on the positioning information. The channel list includes available broadcast media content channel information for the current location of the mobile terminal.

DETAILED DESCRIPTION OF EMBODIMENTS OF THE INVENTION

Figure 1:
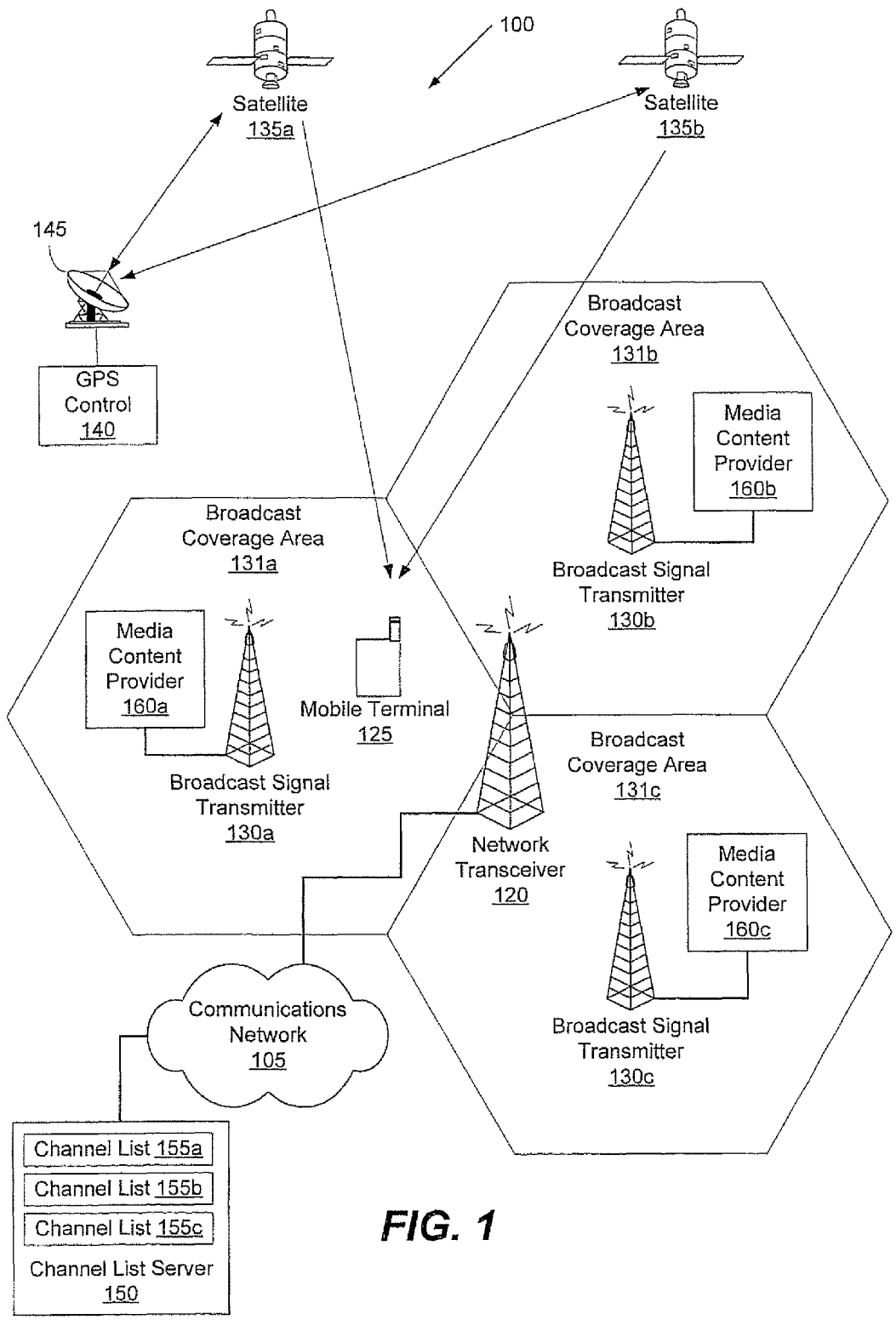
FIG. 1 is a schematic block diagram illustrating systems, methods, and devices for identifying and providing access to broadcast media content according to some embodiments of the present invention.

The present invention now will be described more fully hereinafter with reference to the accompanying drawings, in which illustrated embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items, and may be abbreviated as, "/".

It will also be understood that, although the terms first, second, etc. may be used herein to describe various elements, these elements should not be limited by these terms. These terms are only used to distinguish one element from another. For example, a first receiving station could be termed a second receiving station, and, similarly, a second receiving station could be termed a first receiving station without departing from the teachings of the disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be appreciated by one of skill in the art, the present invention may be embodied as methods, systems, or devices. Accordingly, the present invention may be embodied in hardware and/or in software (including firmware, resident software, micro-code, etc.). Computer program code for carrying out operations of the present invention may be written in an object oriented programming language such as Java®, Smalltalk or C++, a conventional procedural programming languages, such as the "C" programming language, or lower-level code, such as assembly language and/or microcode. The program code may execute entirely on a single processor and/or across multiple processors, as a stand-alone software package or as part of another software package.

The present invention is described below with reference to flowchart illustrations and/or block and/or flow diagrams of methods, systems, and devices according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block and/or flow diagram block or blocks.

These computer program instructions may also be stored in a computer-readable memory that can direct a computer or other programmable processor to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processor to cause a series of operational steps to be performed on the computer or other programmable processor to produce a computer implemented process such that the instructions which execute on the computer or other programmable processor provide steps for implementing the functions or acts specified in the flowchart and/or block diagram block or blocks.

Some embodiments of the present invention may employ location/position determination techniques having certain characteristics in common with conventional location determination techniques. For example, location may be estimated by collecting a requisite number of ranging measurements such as, for example, a time of arrival (TOA), a time difference of arrival (TDOA), and/or an observed time difference (OTD), from signals passed between transmitter(s) and receiver(s), wherein either the transmitter(s) or the receiver(s) have known or determinable locations (i.e., positions). Further, each of the collected ranging measurements can generally be converted from a time interval measurement to a corresponding distance measurement, for example, by multiplying by the speed of light or an expected speed of transmission associated with the signal. When the conversion from time to distance has been accomplished, traditional triangulation, or other like mathematical techniques, can be used to determine the positional coordinates of the mobile device, based on the known locations and calculated distances.

For example, known location techniques include uplink signal location, downlink signal location, Global Positioning System (GPS) based approaches and approaches based on digital television signals. For "uplink signal" location techniques, the mobile telecommunications network is typically configured to determine where the MT is located based on ranging measurements associated with one or more uplink signals. These uplink signals are transmitted by the MT and received by a requisite number of receivers having known locations, such as, for example, cellular telephone base stations (BSs). For the "downlink signal" location techniques, the mobile telecommunications network is typically configured to determine where the MT is located based on ranging measurements associated with the reception, by the MT, of downlink signals from a requisite number of transmitters having known locations.

In the case of a GPS location technique, GPS receivers collect and analyze ranging measurements from signals transmitted by GPS satellites having known locations. More specifically, a constellation of 24 satellites orbiting the earth continually emit a GPS radio signal. A GPS receiver, e.g., a hand-held radio receiver with a GPS processor, receives the radio signals from the closest satellites and measures the time that the radio signal takes to travel from the GPS satellites to the GPS receiver antenna. By multiplying the travel time by the speed of light, the GPS receiver can calculate a range for each satellite in view. Ephemeris information provided in the satellite radio signal typically describes the satellite's orbit and velocity, thereby generally enabling the GPS processor to calculate the position of the GPS receiver through a process of triangulation. Also, as the positions of the GPS satellites may vary with regard to time, a GPS receiver may generally require an accurate measurement of time from the GPS satellites (or an accurate GPS-related source on the ground) in order to know the positions of the GPS satellites at the time of the ranging measurements. The startup of a GPS receiver typically requires the acquisition of a set of navigational parameters from the navigational data signals of four or more GPS satellites. It is known to include a GPS receiver in a mobile terminal to provide position location functionality to the mobile station.

In addition, digital television signals may be used to determine the location of a mobile terminal. For example, as described in "Positioning Using the ATSC Digital Television Signal," Rabinowitz, M. and Spilker, J., Rosum Corporation Whitepaper, www.rosum.com (circa 2001), digital television signals may be broadcast, at least in the United States, from terrestrial digital television transmitters having determinate locations. The Rosum Corporation Whitepaper proposes a technique for determining range information to digital television transmitters using the synchronization fields of the digital television signal. Also, commonly assigned U.S. patent application Ser. No. 11/168,044 describes including identifiable signals and/or range assistance information in digital television signals simulcast from a plurality of transmitters having known locations, and determining ranging information to the digital television transmitters based on the received identifiable signals and/or the range assistance information. The determined ranges may then be used to estimate the position of the mobile terminal.

Thus, the underlying location processes generally uses signals received from certain known positions, and determines ranging measurements from a sufficient number of signals to solve for the mobile device's location. Further discussion of mathematical solutions suitable for use with embodiments the present invention are provided in U.S. Pat. No. 6,252,543. These common characteristics and others will be described below to show how the present invention may advantageously use these location techniques to provide identification and access to broadcast media signals at a determined location.

More particularly, according to some embodiments of the present invention, a channel list describing publicly-accessible broadcast channels configured to provide media content may be automatically retrieved based on the current location of a mobile terminal. FIG. 1 is a block diagram illustrating systems, methods, and devices according to some embodiments of the present invention for identifying and providing access to broadcast media content. Referring now to FIG. 1, a communications system 100 includes a plurality of media content providers 160a-160c, a plurality of broadcast signal transmitters 130a-130c coupled thereto, and a mobile terminal 125. The system 100 also includes a communications network 105 (which may be, for example, a wide-area network or a local area network), a network transceiver 120 coupled thereto, and a channel list server 150 coupled to the communication network 105. The system 100 may further include a plurality of satellites, for example, GPS satellites 135a and 135b. The GPS satellites 135a and 135b may be controlled by a GPS control unit 140 via a satellite dish 145.

The plurality of transmitters 130a-130c are configured to broadcast media content signals, such as radio, television, emergency information, and/or other audio/video signals, over respective channels and over respective broadcast coverage areas 131a-131c. For example, the broadcast media content may be digital television content broadcast according to the Digital Video Broadcasting for Handhelds (DVB-H) protocol. Also, the media content may be broadcast over free-to-air (i.e. publicly accessible) channels. Although only one transmitter per coverage area is illustrated in FIG. 1, it is to be understood that a number of transmitters and/or repeater transmitters may be employed by the media content providers 160a-160c to sufficiently provide broadcast media content over their respective desired coverage areas 131a-131c. Also, although illustrated in FIG. 1 as non-overlapping, it is to be understood that the broadcast coverage areas 131a-131c may be non-overlapping, partially overlapping, or wholly overlapping.

As such, the mobile terminal 125 may receive broadcast media content from one or more of the media service providers 160a-160c, depending on the current location of the mobile terminal 125. In particular, when the mobile terminal 125 is located in broadcast coverage area 131a as illustrated in FIG. 1, the mobile terminal 125 may receive media content from media service provider 160a that is broadcast via transmitter 130a, when tuned to the appropriate channel or frequency. However, the mobile terminal 125 (and/or a user thereof) may be unaware of the particular channel/frequency on which the media content is broadcast. Accordingly, the mobile terminal 125 may be configured to determine positioning information corresponding to its current location and automatically retrieve a channel list for the current location based on the positioning information.

The mobile terminal 125 may be configured to determine positioning information corresponding to its current location using a variety of location calculation techniques, as are well-known in the art. For example, the mobile terminal 125 may be configured to receive GPS communication signals from a plurality of GPS satellites, such as the GPS satellites 135a and/or 135b. As such, the mobile terminal 125 may calculate ranging measurements based on the GPS communication signals and determine the positioning information based on the ranging measurements. More particularly, the ranging measurements between the mobile terminal 125 and each of at least four (4) UPS satellites may be calculated based on the "time of flight" for the respective communication signals received from each GPS satellite, which may then be converted to distance. The resulting four (4) range measurements allow for a solution to the position of the mobile terminal 125 in x, y and z coordinates, and for determination of the unknown time difference between the GPS time and the independent clock of the mobile terminal 125.

In addition, some or all of the transmitters 130a-130c may be configured to provide range assistance information (such as location and/or time correction data) and/or identifiable signals (respectively identifying a signal as transmitted from one of the transmitters 130a-130c) in broadcast media content signals, as discussed in U.S. patent application Ser. No. 11/168,044. A range of the mobile terminal from each of the transmitters 130a-130c may then determined based on the received identifiable signal and/or the range assistance information, and the position of the mobile terminal 125 may be determined using traditional triangulation or other like mathematical techniques based on known location data for each of the transmitters 130a-130c and the calculated ranges.

Based on the positioning information, the mobile terminal 125 may be configured to automatically retrieve a corresponding channel list from the channel list server 150. The channel list server 150 is configured to maintain one or more channel lists 155a-155c respectively including available broadcast media content channel information for one or more of the corresponding coverage areas 131a-131c. For instance, the channel lists 155a-155c may respectively describe one or more DVB-H channels, as well as frequency and/or decoding information that may be required to access each channel, that are broadcast over the corresponding coverage areas 131a-131c. The channel list server 150 may also include a public land mobile network (PLMN) transceiver and/or a wireless local area network transceiver. As such, the channel list server 150 may be accessed by the mobile terminal 125 via the network 105 over a packet-switched connection, such as a GPRS/IP connection, or a circuit-switched connection. In addition, the channel list server 150 may be accessed via an ad-hoc wireless connection with the mobile terminal 125, such as an infrared (IR), WI-FI®, and/or BLUETOOTH® connection.

Accordingly, the mobile terminal 125 may be configured to automatically retrieve the channel list 155*a* from the channel list server 150 based on its current location in broadcast coverage area 131*a*, as shown in FIG. 1. For example, the mobile terminal 125 may automatically retrieve the channel list 155*a* responsive to activation of a mobile terminal application configured for presentation of the broadcast media content. More particularly, when the broadcast media content presentation application is launched, the mobile terminal 125 may transmit a channel list request including the determined positioning information to the channel list server 150. The channel list request may be included, for example, in a short message service (SMS) and/or a multimedia message service (MMS) message that is transmitted to the server 150. The channel list server 150 may receive the channel list request, identify the channel list 155*a* as corresponding to the current location of the mobile terminal 125 based on the positioning information, and transmits the channel list 155*a* to the mobile terminal 125 via the network 105 and the transceiver 120. The channel list 155*a* may also be transmitted to the mobile terminal 125 in a SMS and/or a MMS message. The mobile terminal 125 may be tuned to a particular channel, for example, responsive to a user selection of one of the channels listed on the channel list 155*a*. As such, media content broadcast on the selected channel may be received and presented via the mobile terminal 125.

In addition, the channel lists 155*a*-155*c* may include information regarding the approximate geographic broadcast coverage areas for the listed channels. As such, the mobile terminal 125 may be able to anticipate when a new channel list may be needed. More particularly, the mobile terminal 125 may be configured to re-determine its positioning information at periodic and/or intermittent periods of time, and compare the re-determined position information with the coverage areas for one or more channels to determine when it is within a predetermined range of an end of one or more of the coverage areas. For example, when the mobile terminal 125 of FIG. 1 moves near an end of the coverage area 131*a* (adjacent to coverage area 131*b*), the mobile terminal 125 may automatically retrieve the channel list 155*b* from the server 150. Thus, the mobile terminal 125 may automatically retrieve a new channel list in anticipation of moving beyond the respective coverage areas of one or more channels on a retrieved channel list.

The mobile terminal 125 may also anticipate when to request a new channel list based on the quality of service (QoS) of the received media content signal. The QoS of the received media content signal may be based on the transmission rate, bit error rate (BER), and/or other factors. As such, the QoS may indicate that the mobile terminal 125 has moved beyond the coverage area for the currently-selected channel. Accordingly, the mobile terminal 125 may be configured to re-determine its positioning information and automatically retrieve a new channel list when the QoS falls below a minimum value or other predetermined threshold.

However, in some systems according to embodiments of the present invention, accurate position determination may not be required to identify available broadcast channel information. For example, where the broadcast coverage area for one or more channels is relatively large, only a general location of the mobile terminal 125 may be needed to retrieve a corresponding channel list. As such, network-based positioning technologies, such as cell identification, may provide sufficient positioning information. More specifically, the positioning information may identify a cell in the network that corresponds to the current location of the mobile terminal, and a channel list describing channels having a coverage area corresponding to the cell may be retrieved. In addition, for a smaller countries, a relatively large broadcast coverage area may substantially cover or even exceed the boundaries of the countries. In such cases, the positioning information may identify only a country code corresponding to the current location of the mobile terminal, and the retrieved channel list may specify one or more channels having a geographic coverage area corresponding to the identified country.

Also, in some embodiments, the mobile terminal may be configured to automatically retrieve the desired channel list from locations other than the channel list server 150. For example, the mobile terminal 125 may store one or more previously retrieved channel lists in its internal memory, which may respectively be associated with the positioning information used to request the channel lists. As such, upon returning to a location, the mobile terminal 125 may automatically retrieve a corresponding channel list associated with from its internal memory based on the associated positioning information.

Furthermore, the mobile terminal 125 may be configured to automatically perform an internet search to retrieve the channel list for the current location based on the positioning information. Although such an approach may be more time-consuming than downloading the channel list from the server 150, it may be useful in a situation where the server 150 for some reason does not include a channel list for a given location.

In addition, in some embodiments, the mobile terminal 125 may be configured to scan a particular frequency band for the available broadcast channel information based on the positioning information. For example, where the positioning information includes the country code, the mobile terminal 125 may identify a particular frequency band as used for broadcasting media content in the country designated by the country code. As such, identification of the country where the mobile terminal 125 is currently located may significantly reduce the time required to scan for available channels. In addition, the mobile terminal 125 may be configured to scan a particular frequency band in parallel with automatically retrieving the channel list from the server 150. Thus, the mobile terminal 125 may be configured to perform a hybrid of conventional searching and/or scanning techniques along with position determination to identify available broadcast channel information.

Moreover, in some embodiments, the channel list server 150 may be configured to determine the positioning information corresponding to the current location of the mobile terminal 125, and may be configured to automatically retrieve one of the channel lists 155*a*-155*c* based on the determined positioning information. For example, the channel list server 150 may determine that the mobile terminal 125 is currently located in a particular cell using cell identification and/or other network-based positioning technologies, as described above. As such, the channel list server 150 may identify the channel list 155*a* as corresponding to the current location of the mobile terminal 125 based on the positioning information, and may transmit the channel list 155*a* to the mobile terminal 125 via the network 105 and the transceiver 120. Accordingly, in some embodiments, the channel list server 150 (or other network server) may be configured to automatically retrieve and forward an applicable channel list to the mobile terminal 125 without receiving a request therefor.

Although the communications system 100 has been described with reference to specific elements as shown in FIG. 1, communication systems according to embodiments of the present invention are not limited to the elements illustrated therein and may include additional elements which may be configured to perform the operations and/or functions described herein. For example, although illustrated as a central server configured to store a plurality of channel lists 155a-155c, the channel list server 150 may be a plurality of servers distributed throughout the system 100, and each server may be configured to store one or more of the channel lists 155a-155c for each of the broadcast coverage areas 131a-131c. Also, while illustrated in FIG. 1 as terrestrial transmitters, some or all of the transmitters 130a-130c may be satellite transmitters configured to broadcast media content to the corresponding coverage areas 131a-131c. In addition, although specific position calculation techniques have been described herein, it is to be understood that embodiments of the present invention are not limited to these techniques and may employ other position calculation techniques.

Figure 2:
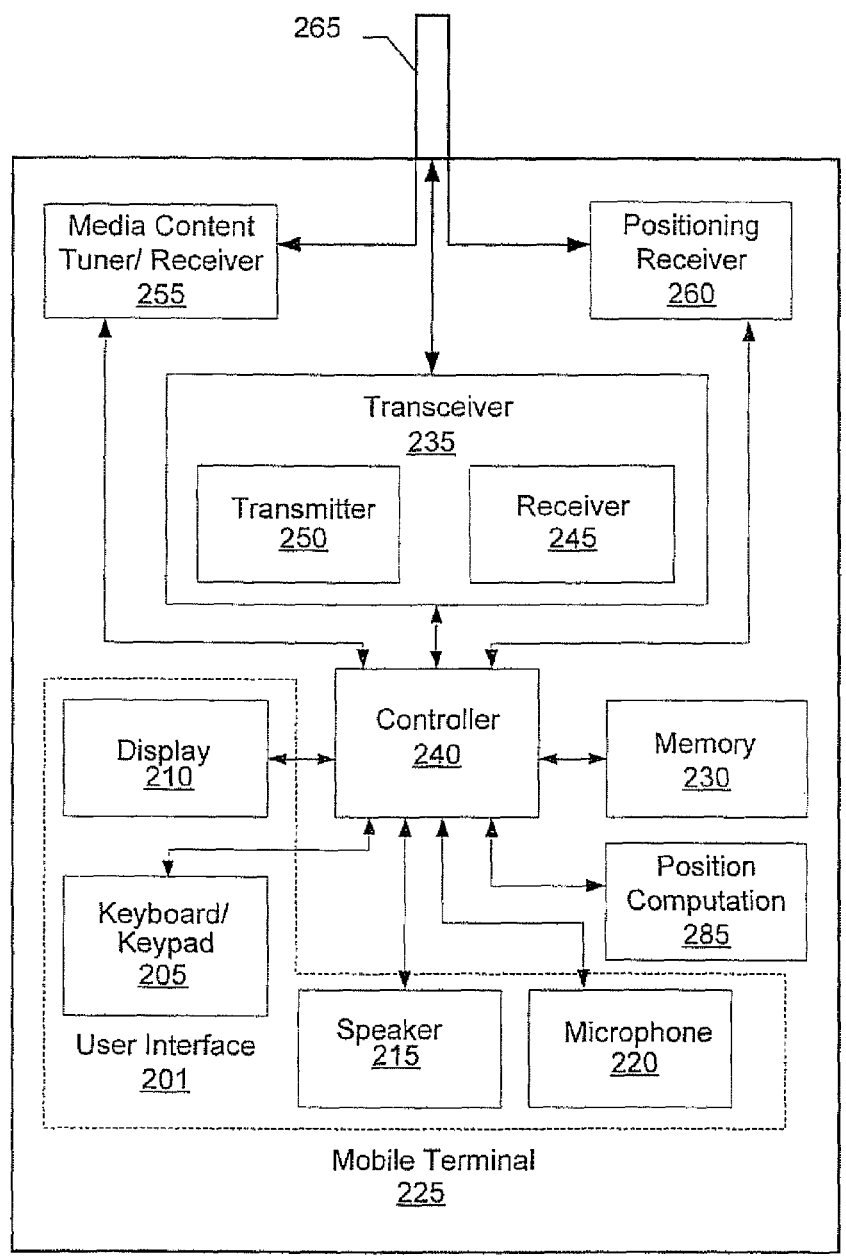
FIG. 2 is a schematic block diagram illustrating a mobile terminal according to some embodiments of the present invention.

FIG. 2 is a schematic block diagram illustrating a mobile terminal 225 according to some embodiments of the present invention. In some embodiments, the mobile terminal 225 may correspond to the mobile terminal 125 illustrated in FIG. 1. Referring now to FIG. 2, the mobile terminal 225 includes a user interface 201, a transceiver 235, and a memory 230 that communicate with a controller 240. The user interface 201 may include a keyboard/keypad 205, a display 210, a speaker 215, and a microphone 220. However, additional and/or fewer elements of the user interface 255 may actually be provided depending on the functionalities offered by the mobile terminal 225.

The transceiver 235 may typically include a transmitter circuit 250 and a receiver circuit 245, which respectively transmit outgoing radio frequency signals and receive incoming radio frequency signals via an antenna 265. The radio frequency signals may include both traffic and control signals (e.g., paging signals/messages for incoming calls), which may be used to establish and maintain communication with another party or destination. For example, the transceiver 235 may include a public land mobile network (PLMN) transceiver and/or a wireless local area network (WLAN) transceiver. As such, the mobile terminal 225 may use the PLMN transceiver and/or the WLAN transceiver to establish a wireless connection with a server, such as the channel list server 150, via a base station/network transceiver. The wireless connection may be a packet-switched connection, such as that provided by the Enhanced Data GSM Environment (EDGE) standard, the General Packet Radio Service (GPRS) standard, and/or the Universal Mobile Telecommunications System (UMTS) standard, or a circuit-switched connection. In addition, the wireless connection may be an ad-hoc wireless network connection between the mobile terminal 225 and the server, such as a BLUETOOTH®, WI-FI® and/or infrared (IR) connection. While a single antenna 265 is shown in FIG. 2, it should be understood that multiple antennas and/or different types of antennas may be utilized based on the types of signals being received.

The foregoing components of the mobile terminal 225 may be included in many conventional mobile terminals and their functionality is generally known to those skilled in the art. It should be further understood that, as used herein, the term "mobile terminal" or "mobile device" may include conventional cell phones, Personal Communications Systems (PCS)/smart phones that may include data processing, voice, video, text message, e-mail and/or Web access capabilities, Personal Digital Assistants (PDA) with wireless communications capabilities, wireless pagers, Blackberry wireless handheld e-mail devices, laptop computers, portable televisions, radios, and/or other devices that may include a radiotelephone transceiver. In addition, the mobile terminal 225 according to some embodiments of the present invention may include a media content tuner/receiver 255 and a positioning receiver 260, as will be described in detail below.

Still referring to FIG. 2, the controller 240 may be, for example, a commercially available or custom microprocessor that is configured to coordinate and manage operations of the transceiver 235, the memory 230, the receivers 255 and 260, the position computation circuit 285, and the user interface 201. As such, the mobile terminal controller 240 may be configured to determine positioning information corresponding to a current location of the mobile terminal 225 based on positioning signals received at the positioning receiver 260, and may be configured to automatically retrieve a channel list including available broadcast channel information for the current location of the mobile terminal 225 via the transceiver 235 based on the positioning information. The controller 240 may be configured to retrieve the channel list, for example, responsive to activation of a mobile terminal application that is configured to present the broadcast media content.

More specifically, as shown in FIG. 2, the mobile terminal 225 may include a positioning receiver 260, such as a GPS receiver, coupled to the controller 240. The positioning receiver 260 may be configured to receive a plurality of positioning signals, calculate ranging measurements based on the plurality of positioning signals, and determine the positioning information based on the rangino measurements. For example, the positioning receiver 260 may be configured to receive the positioning signals from GPS satellites (such as the GPS satellites 135a and 135b of FIG. 1), terrestrial transmitters (such as the transmitters 130a-130c of FIG. 1), and/or a combination thereof. The mobile terminal 225 may also include a position computation circuit 285 that is configured to estimate a position of the mobile terminal 225 based on the determined ranging measurements. For example, the position computation circuit 285 may be configured to internally perform the calculations based on the ranging measurements to determine the positioning information at the mobile terminal 225 itself. However, in some embodiments, the position computation circuit 285 may also be configured to provide range estimates to a remote position determination server via the transmitter 250. While the position computation circuit 285 and the controller 240 are illustrated as distinct blocks in FIG. 2, it is to be understood that the functionality of these blocks may be combined into a single controller and/or spread across a plurality of different controllers and/or other hardware configured to operate in a manner described herein. As such, the positioning receiver 260, in cooperation with the controller 240 and the position computation circuit 285, may provide a processing circuit configured to process received positioning signals to determine positioning information for the mobile terminal 225.

Accordingly, when a media content presentation application is launched on the mobile terminal 225, the transmitter 250 may be configured to transmit a channel list request including the positioning information to a server configured to maintain the channel list for the current location, such as the channel list server 150 of FIG. 1. The receiver 245 may be configured to receive the channel list for the current location from the server responsive to transmission of the channel list request. The channel list may include at least one available channel for the current location of the mobile terminal, and frequency and/or other decoding information corresponding to the listed channel(s). In some embodiments, the listed channels may be free over-the-air broadcast channels. As discussed above, the channel list request and/or the channel list may be included in a short message service (SMS) and/or a multimedia message service (MMS) message communicated between the mobile terminal 225 and the server.

Based on the received channel list, the mobile terminal 225 may be configured to be tuned to an available channel based on the corresponding frequency information to receive the media content that is broadcast over the at least one available channel. More particularly, as shown in FIG. 2, the mobile terminal 225 may include a broadcast media content tuner/receiver 255, such as a DVB-H tuner/receiver, coupled to the controller 240. The broadcast media content tuner/receiver 255 may be tuned to an available channel based on the corresponding frequency information, and may present the received media content via the user interface 201. For example, the user interface 201 may be configured to display the channel list via the display 210 and receive a user selection indicating one of the available channels from the channel list via the keypad 205. The controller 240 may tune the broadcast media content tuner/receiver 255 to the selected channel responsive to receipt of the user selection at the user interface 201. As such, the broadcast media content tuner/receiver 255, in cooperation with the controller 240, may provide a signal processing circuit configured to process DVB-H signals and/or other broadcast signals received from media content transmitters, such as the transmitters 130a-130c of FIG. 1.

The memory 230 may be configured to store the frequency information corresponding to the available channel(s) included in the retrieved channel lists as channel preset information associated with the positioning information. Thus, the channel list for a particular location may be stored internally, and may thereby be subsequently used when the mobile terminal 225 returns to the current location. More particularly, the mobile terminal 225 may be configured to automatically retrieve the channel list for the particular location from the memory 230 responsive to determining positioning information that matches the positioning information associated with the stored channel list. As such, in some embodiments, a previously stored channel list may be automatically retrieved from the internal memory 230 of the mobile terminal, rather than from an external server.

In addition, in some embodiments, the broadcast media content signals may include GPS assistance information, such as satellites in view, approximate location, accurate time signals and/or ephemeris data for the satellites. As such, the position computation circuit 285 may be configured to estimate the position of the mobile terminal 225 based on both received DVB-H signals and/or GPS communication signals.

Also, the position computation circuit 285 may be configured to provide positioning information indicating only a general location of the mobile terminal 225. For example, where the broadcast signal transmitters cover a relatively large area, the positioning information provided by the position computation circuit 285 may identify a cell in the network that corresponds to the current location of the mobile terminal 225, and a channel list describing channels having a coverage area corresponding to the identified cell may be retrieved. In addition, for a smaller countries, a relatively large broadcast coverage area may substantially cover or even exceed the boundaries of the countries. In such cases, the position computation circuit 285 may identify only a country code corresponding to the current location of the mobile terminal 225, and the retrieved channel list may specify one or more channels having a geographic coverage area corresponding to the identified country.

Although illustrated in FIG. 2 as separate components, the media content receiver 255, the positioning receiver 260, and/or the receiver 245 may be implemented in a single module. As such, the mobile terminal 225 may be configured to receive both DVB-H protocol signals and GPS communication signals during respective distinct timeslots using a common receiver. For instance, for DVB-H channels at 1670 MHz, the receiver may be time-shared between GPS reception and DVB-H reception without retuning an associated antenna circuit, as this DVB-H frequency is close to the 1570 MHz GPS frequency. More generally, although the present invention may be embodied in communication systems and/or devices such as the mobile terminal 225 of FIG. 2, the present invention is not limited to such devices and/or systems.

Figure 3:
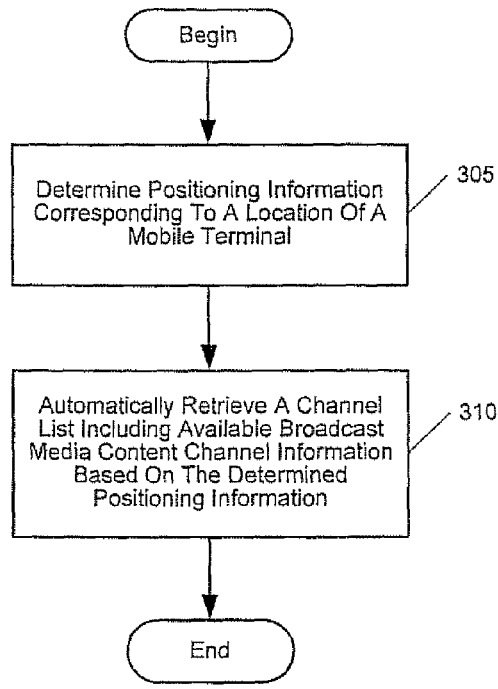
FIG. 3 is a flowchart illustrating operations for providing access to available broadcast media content according to some embodiments of the present invention.

FIG. 3 is a flowchart illustrating operations for providing access to broadcast media content according to some embodiments of the present invention. More particularly, FIG. 3 illustrates operations that may be carried out by a mobile terminal, such as the mobile terminal 125 of FIG. 1, and/or a server, such as the channel list server 150, for providing access to broadcast media content, such as television, radio, and/or emergency information signals. As shown in FIG. 3; operations begin at Block 305 when positioning information corresponding to a location of a mobile terminal is determined. For example, the positioning information may be determined using one or more well-known position calculation techniques, such as GPS. More particularly, the positioning information may be determined from ranging measurements, which may be calculated based on receipt of a plurality of GPS positioning signals.

Still referring to FIG. 3, a channel list including available broadcast media content channel information is automatically retrieved at Block 310 based on the positioning information. For example, a channel list specifying at least one available free over-the-air broadcast channel (and corresponding frequency and/or decoding information) for the current location of the mobile terminal may be automatically retrieved responsive to activation of a media content presentation application on the mobile terminal. In some embodiments, the channel list may be automatically retrieved from a server configured to maintain one or more channel lists. In other embodiments, the channel list may be automatically retrieved from the internal memory of the mobile terminal rather than from an external server, for example, in a case where a desired channel list has been previously stored in the internal memory of the mobile terminal.

In addition, in some embodiments, the broadcast coverage area for one or more channels may be relatively large, such that only a general position of the mobile terminal may be required to automatically retrieve an appropriate channel list. Accordingly, positioning information corresponding to a general location of the mobile terminal may be determined at Block 305 using well-known network-based positioning technologies, such as identification of a cell or even identification of a country code corresponding to the current location of the mobile terminal. As such, a channel list including one or more channels having a geographic coverage area corresponding to the particular cell or country identified in the positioning information may be automatically retrieved at Block 310 based on the general positioning information.

Figures 4A, 4B:
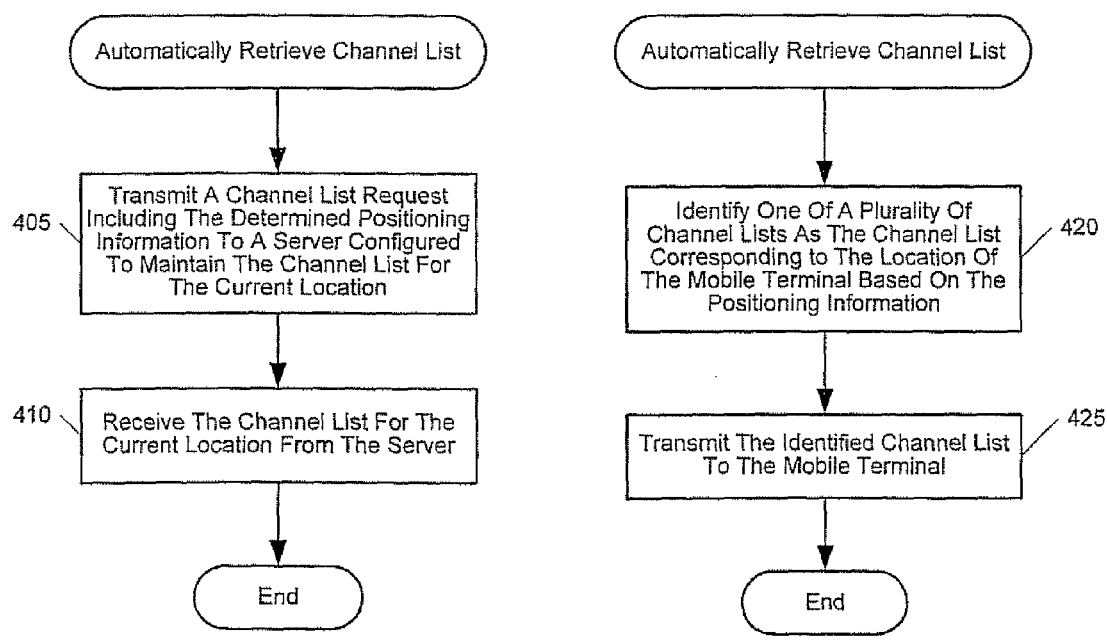
FIGS. 4A and 4B are flowcharts illustrating operations for automatically retrieving a channel list to access broadcast media content according to some embodiments of the present invention.

FIGS. 4A and 4B are flowcharts illustrating operations for automatically retrieving a channel list according to some embodiments of the present invention. More particularly, FIG. 4A illustrates operations that may be carried out by a mobile terminal, such as the mobile terminal 225 of FIG. 2. Referring now to FIG. 4A, a channel list request is transmitted to a server that is configured to maintain the channel list for the current location at Block 405. For example, the channel list request may be automatically transmitted when a media content application is launched on the mobile terminal. The channel list request may include the positioning information for the mobile terminal determined by a variety of position determination techniques, as discussed above. A channel list corresponding to the mobile terminal's location may thereby be identified by the server and provided to the mobile terminal based on the positioning information included in the channel list request As such, the channel list corresponding to the location of the mobile terminal is received from the server at Block 410. The channel list may be automatically retrieved via a packet-switched or circuit-switched connection to the server via a network, such as the communications network 105 of FIG. 1. For example, the channel list may be requested by sending an SMS/MMS message including the positioning information to the server, which may reply with an SMS/MMS message containing the channel list. In addition, the channel list may be retrieved via an ad-hoc wireless network connection established with the server, such as a BLUETOOTH®, WI-FI®, and/or IR connection.

FIG. 4B illustrates operations for automatically retrieving the channel list that may be carried out by a server, such as the channel list server 150 of FIG. 1. Referring now to FIG. 4B, operations begin at Block 420 when one of a plurality of channel lists maintained by a server is identified as corresponding to a current location of the mobile terminal. More particularly, a plurality of channel lists corresponding to a plurality of different locations may be maintained by the server. Each channel list may include one or more broadcast channels/frequencies that are available for reception at each of the different locations. As such, the channel list corresponding to the current location of the mobile terminal may be identified based on positioning information for the mobile terminal. For example, the presence of the mobile terminal in the network may be detected by the server (or other network element), and positioning information corresponding to the current location of the mobile terminal may be determined using a variety of position determination techniques, as discussed above. In addition, a channel list request including the positioning information may be received at the server, and the corresponding channel list may be identified based on the positioning information provided in the channel list request. Accordingly, the identified channel, list for the location corresponding to the positioning information is transmitted to the mobile terminal at Block 425. The channel list may be transmitted over a packet-switched or circuit-switched connection to the mobile terminal via a network, such as the communications network 105 of FIG. 1. In addition, the channel list may be transmitted via an ad-hoc wireless network connection established with the mobile terminal, such as a BLUETOOTH®, WI-FI®, and/or IR connection.

Figure 5:
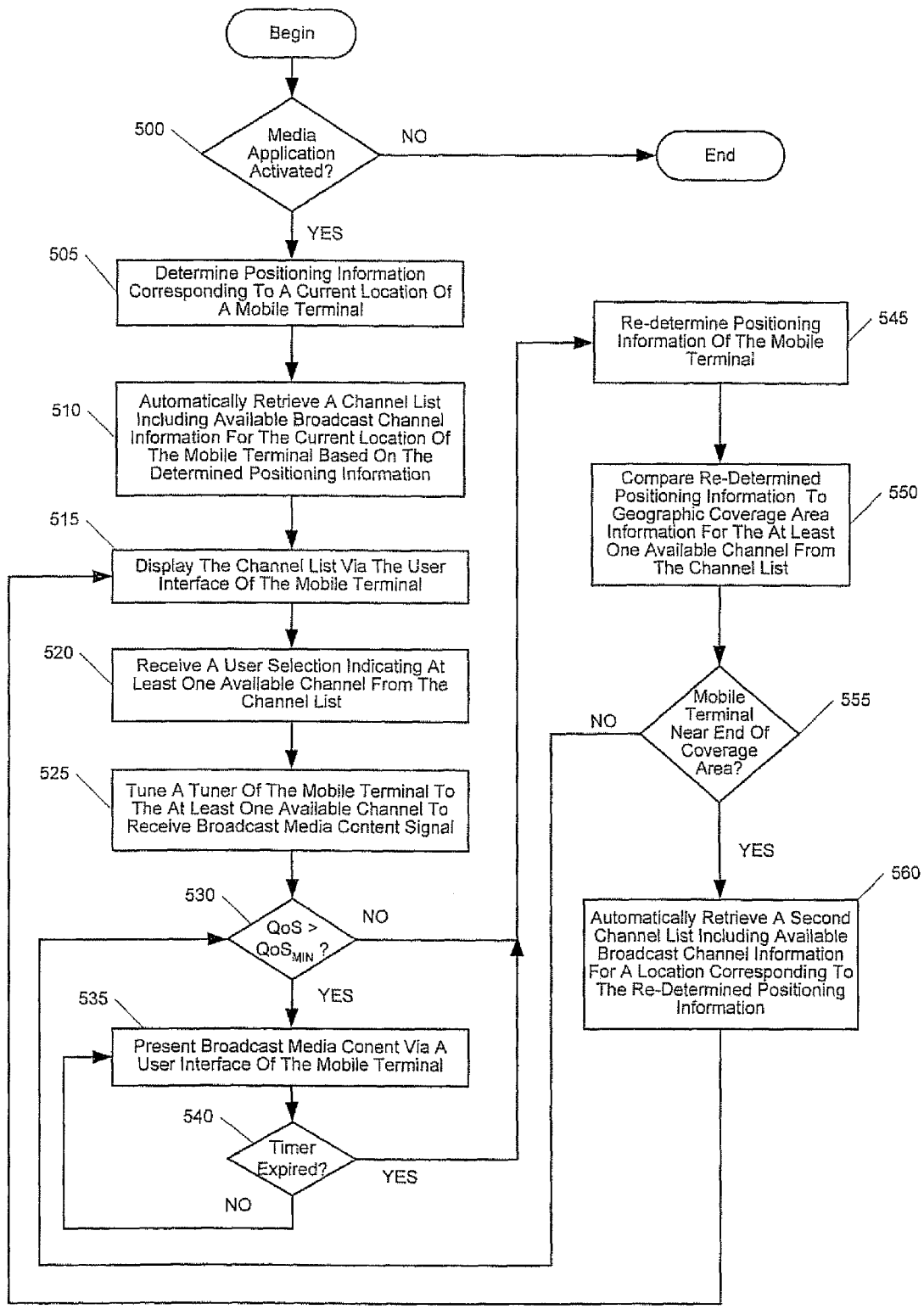
FIG. 5 is a flowchart illustrating operations for identifying and providing access to broadcast media content according to further embodiments of the present invention.

FIG. 5 is a flowchart illustrating detailed operations for providing access to broadcast media content according to some embodiments of the present invention. For example, FIG. 5 illustrates operations that may be performed by a mobile terminal, such as the mobile terminal 225 of FIG. 2, for identifying and presenting broadcast media content, such as broadcast television, radio, and/or emergency information. As shown in FIG. 5, operations begin at Block 500 by determining whether an application configured to present broadcast media content has been activated or "launched" on the mobile terminal. If so, positioning information corresponding to a current location of the mobile terminal is determined at Block 505. As mentioned above, number of different location calculation techniques may be used to determine the positioning information. As such, these location techniques will not be discussed further hereinafter.

At Block 510, a channel list including available broadcast channel information for the current location is automatically retrieved based on the determined positioning information. For example, the channel list may be received via a network connection to a server configured to maintain one or more channel lists, such as the channel list server 150 of FIG. 1, responsive to launching the media content presentation application. The channel list is displayed via the user interface of the mobile terminal at Block 515, and a user selection indicating one of the channels from the channel list is received at Block 520. For example, the channel list may be shown on a display of the mobile terminal, and the user selection may be received via navigation keys of the mobile terminal. Based on the user selection, a tuner of the mobile terminal may be tuned to a frequency corresponding to the selected channel to receive the media content signal broadcast over the channel at Block 525.

At Block 530, it is determined whether the quality of service (QoS) of the received media content is above a threshold value for minimum quality of service ($QoS_{MIN}$). If the QoS is above the threshold value, the media content is presented via the user interface of the mobile terminal at Block 535. For example, where the media content is radio content, the music and/or other audio provided over the selected channel may be presented via speakers of the mobile terminal. In addition, where the media content is television content, the corresponding video and audio may be presented via the display and the speakers of the mobile terminal. Also, at Block 540, it is determined whether a timer for re-determining the positioning information has expired. If the timer has not expired, the mobile terminal continues to present the media content at Block 535.

However, if the QoS of the received media content falls below the minimum quality of service threshold value $QoS_{MIN}$ at Block 530, and/or if the predetermined amount of time has expired at Block 540, the positioning information for the mobile terminal is re-determined at Block 545. For example, when the QoS is below the threshold value, the reduced QoS may indicate that the location of the mobile terminal has changed and/or moved beyond the coverage area for the selected channel. In addition, the mobile terminal may be configured to re-determine the positioning information at periodic and/or intermittent periods of time based on the timer, to proactively determine whether the location of the mobile terminal has changed. At Block 550, the re-determined positioning information is compared to geographic coverage area information for the currently-selected channel, which may be included in the channel list. For example, the channel list may include a description of the geographic broadcast coverage area corresponding to each channel included in the channel list. As such, it is determined whether the mobile terminal is within a predetermined range of or is otherwise approaching an end of the coverage area for the currently-selected channel at Block 555. If the mobile terminal is not near the end of the coverage area (i.e., if the mobile terminal location has not substantially changed since the previous determination of the positioning information), operations return to Blocks 530, 535, and 540, where the mobile terminal continues to present the broadcast media content so long as the QoS is above the minimum threshold value $QoS_{MIN}$ and the timer has not expired.

On the other hand, if it is determined at Block 555 that the mobile terminal is within a predetermined range of the end of the coverage area, a second or "new" channel list is automatically retrieved at Block 560 based on the re-determined positioning information. More particularly, a second channel list including available broadcast channel information for a location corresponding to the re-determined positioning information may be automatically retrieved by the mobile terminal when the mobile terminal nears the end of the coverage area for the currently-selected channel, in anticipation of a reduced QoS and/or loss of service. In such a case, operations return to Block 515, and the newly retrieved channel list is displayed via the user interface of the mobile terminal for selection of a new channel by the user.

As such, a second channel list may be proactively retrieved by the mobile terminal based on the QoS of the received signal and/or the location of the mobile terminal within a given broadcast coverage area. Although FIG. 5 illustrates that both conditions of 1) a QoS below the minimum threshold value and 2) a current location within a predetermined range of the end of the coverage area for the selected channel should be met prior to automatically retrieving a new channel list, it is to be understood that either of these conditions may trigger automatic retrieval of a new channel list according to some embodiments of the present invention.

More generally, the flowcharts, flow diagrams, and block diagrams of FIGS. 1-5 illustrate the architecture, functionality, and operations of possible implementations of systems, methods, and devices for determining the location of a mobile device based on simulcast communications signals according to some embodiments of the present invention. In this regard, each block in the flowcharts or block diagrams may represent a module, segment, or portion of code which comprises one or more executable instructions for implementing the specified logical acts. It should also be noted that, in some embodiments, the acts noted in the blocks may occur out of the order noted in the figures. For example, two blocks shown in succession may, in fact, be executed substantially concurrently, or the blocks may sometimes be executed in the reverse order, depending on the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A method for providing access to broadcast media content, the method comprising:
   determining positioning information corresponding to a location of a mobile terminal;
   automatically retrieving a first channel list comprising available broadcast media content channel information based on the determined positioning information, wherein the first channel list includes boundaries of a geographic coverage area for at least one available channel included in the first channel list and frequency information corresponding to the at least one available channel;
   tuning a tuner of the mobile terminal to the at least one available channel based on the corresponding frequency information to receive media content broadcast over the at least one available channel;
   presenting the received media content via a user interface of the mobile terminal;
   determining an occurrence of a first condition based on a predetermined quality of service (QoS) threshold or a predetermined amount of time;
   responsive to the occurrence of the first condition, re-determining the positioning information of the mobile terminal;
   comparing the re-determined positioning information of the mobile terminal to the boundaries of the geographic coverage area for the at least one available channel;
   determining an occurrence of a second condition wherein the mobile terminal is within a predetermined range of an end of the geographic coverage area for the at least one available channel responsive to the comparing; and
   responsive to the occurrence of the second condition, automatically retrieving a second channel list comprising available broadcast media content channel information for a location corresponding to the re-determined positioning information.

2. The method of claim 1, wherein automatically retrieving the first channel list comprises:
   transmitting a channel list request including the determined positioning information from the mobile terminal to a server configured to maintain the first channel list for the location of the mobile terminal; and
   receiving, at the mobile terminal, the first channel list for the location from the server responsive to transmitting the channel list request.

3. The method of claim 1, wherein automatically retrieving the first channel list comprises:
   at a server configured to maintain a plurality of channel lists for a corresponding plurality of locations, identifying one of the plurality of channel lists as the first channel list for the location of the mobile terminal based on the determined positioning information; and
   transmitting the first channel list to the mobile terminal.

4. The method of claim 3, further comprising:
   receiving a channel list request including the determined positioning information at the server,
   wherein transmitting the first channel list comprises transmitting the first channel list to the mobile terminal responsive to receiving the channel list request.

5. The method of claim 1, wherein automatically retrieving the first channel list comprises:
   automatically retrieving the first channel list responsive to activation of a mobile terminal application configured to present the broadcast media content.

6. The method of claim 1, further comprising:
   displaying the first channel list via the user interface of the mobile terminal; and
   receiving a user selection indicating the at least one available channel from the first channel list via the user interface,
   wherein tuning the tuner is performed responsive to receiving the user selection.

7. The method of claim 1, further comprising:
   storing the frequency information corresponding to the at least one available channel in the mobile terminal as channel preset information associated with the positioning information.

8. The method of claim 1, further comprising:
   determining a quality of service (QoS) for the received media content, wherein re-determining the positioning information comprises re-determining the positioning information of the mobile terminal when the QoS falls below the predetermined QoS threshold.

9. The method of claim 1, wherein at least one of the first channel list or the second channel list comprises information corresponding to at least one free over-the-air broadcast media content channel.

10. The method of claim 9, wherein the broadcast media content comprises at least one of digital television, digital radio, and emergency information signals.

11. The method of claim 1, wherein determining the positioning information of the mobile terminal is performed using a first mobile terminal receiver, and wherein at least one of automatically retrieving the first channel list or automatically retrieving the second channel list is performed using a second mobile terminal receiver.

12. The method of claim 11, wherein the first mobile terminal receiver comprises a global positioning system (GPS) receiver, and wherein the second mobile terminal receiver comprises at least one of a wireless local area network transceiver or a public land mobile network transceiver.

13. The method of claim 1, wherein automatically retrieving the first channel list comprises:
automatically performing an internet search for the first channel list for the location of the mobile terminal responsive to determining the positioning information.

14. The method of claim 1, wherein determining the positioning information comprises:
identifying a cell in a network corresponding to the location of the mobile terminal,
wherein automatically retrieving the first channel list comprises automatically retrieving the first channel list comprising at least one channel having a geographic coverage area corresponding to the identified cell.

15. The method of claim 1, wherein determining the positioning information comprises:
identifying a country code corresponding to the location of the mobile terminal,
wherein automatically retrieving the first channel list comprises automatically retrieving the first channel list comprising at least one channel having a broadcast frequency corresponding to a frequency band associated with the country code.

16. The method of claim 1, wherein determining the positioning information comprises:
receiving a plurality of positioning signals at the mobile terminal;
calculating ranging measurements based on the plurality of positioning signals; and
determining the positioning information based on the ranging measurements.

17. The method of claim 1, further comprising:
scanning a frequency band for the available broadcast media content channel information in parallel with automatically retrieving the first channel list or automatically retrieving the second channel list.

18. A computer program product for providing access to broadcast media content, the computer program product comprising:
a non-transitory computer readable storage medium including computer readable program code therein, the computer readable program code configured to carry out the method of claim 1.

19. A mobile terminal, comprising:
a receiver;
a controller coupled to the receiver and configured to determine positioning information corresponding to a location of the mobile terminal and automatically retrieve a first channel list comprising available broadcast media content channel information via the receiver based on the positioning information, wherein the first channel list includes boundaries of a geographic coverage area for at least one available channel included in the first channel list and frequency information corresponding to the at least one available channel;
a tuner coupled to the controller and configured to be tuned to the at least one available channel based on the corresponding frequency information to receive media content broadcast over the at least one available channel; and
a user interface coupled to the controller and configured to present the received media content,
wherein the controller is further configured to determine an occurrence of a first condition based on a predetermined quality of service (QoS) threshold or a predetermined amount of time, re-determine the positioning information of the mobile terminal responsive to the occurrence of the first condition, compare the re-determined positioning information of the mobile terminal to the boundaries of the geographic coverage area for the at least one available channel, determine an occurrence of a second condition wherein the mobile terminal is within a predetermined range of an end of the geographic coverage area for the at least one available channel responsive to the comparison, and automatically retrieve a second channel list comprising available broadcast media content channel information for a location corresponding to the re-determined positioning information via the receiver responsive to the occurrence of the second condition.

20. The mobile terminal of claim 19, wherein the receiver comprises a transceiver configured to transmit a channel list request including the positioning information to a server configured to maintain the first channel list for the location of the mobile terminal, and receive the first channel list for the location of the mobile terminal from the server responsive to transmission of the channel list request.

21. The mobile terminal of claim 20, wherein at least one of the channel list request, the first channel list, or the second channel list comprises a short message service (SMS) message.

22. The mobile terminal of claim 19, wherein the controller is configured to automatically retrieve the first channel list responsive to activation of a mobile terminal application configured to present the broadcast media content.

23. The mobile terminal of claim 19, wherein the user interface is configured to display the first channel list and receive a user selection indicating the at least one available channel from the first channel list, and wherein the tuner is configured to be tuned to the at least one available channel responsive to receipt of the user selection at the user interface.

24. The mobile terminal of claim 19, further comprising:
a memory device coupled to the controller and configured to store the frequency information corresponding to the at least one available channel as channel preset information associated with the positioning information.

25. The method of claim 19, wherein the tuner is configured to scan a frequency band for the available broadcast channel information when the controller automatically retrieves the first channel list.

26. The mobile terminal of claim 19, wherein the controller is further configured to determine a quality of service (QoS)

for the received media content, and to re-determine the positioning information of the mobile terminal when the QoS falls below the predetermined QoS threshold.

27. The mobile terminal of claim 19, wherein at least one of the first channel list or the second channel list comprises information corresponding to at least one free over-the-air broadcast media content channel.

28. The mobile terminal of claim 19, wherein the receiver comprises:
   a first receiver configured to be used for determining the positioning information of the mobile terminal; and
   a second receiver configured to be used for at least one of automatically retrieving the first channel list or automatically retrieving the second channel list.

29. The mobile terminal of claim 28, wherein the first receiver comprises a global positioning system (GPS) receiver, and wherein the second receiver comprises at least one of a wireless local area network transceiver and a public land mobile network transceiver.

30. The mobile terminal of claim 19, wherein the controller is further configured to automatically perform an internet search for the first channel list for the location of the mobile terminal responsive to determination of the positioning information.

31. The mobile terminal of claim 19, wherein the positioning information identifies a cell in a network corresponding to the location of the mobile terminal, and wherein the first channel list comprises at least one channel having a geographic coverage area corresponding to the identified cell.

32. The mobile terminal of claim 19, wherein the positioning information identifies a country code corresponding to the location of the mobile terminal, and wherein the first channel list comprises at least one channel having a broadcast frequency corresponding to a frequency band associated with the country code.

33. The mobile terminal of claim 19, wherein the controller is configured to receive a plurality of positioning signals via the receiver, calculate ranging measurements based on the plurality of positioning signals, and determine the positioning information based on the ranging measurements.

* * * * *